United States Patent
Hung (10) Patent No.: US 10,251,281 B2
(45) Date of Patent: Apr. 2, 2019

(54) METHOD FOR MANUFACTURING ELECTRONIC DEVICES

(71) Applicant: AbleGo Technology Co., Ltd., Hsinchu (TW)

(72) Inventor: Shu-Hui Hung, Hsinchu (TW)

(73) Assignee: ABLEGO TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 15/966,484

(22) Filed: Apr. 30, 2018

(65) Prior Publication Data

US 2018/0249582 A1 Aug. 30, 2018

Related U.S. Application Data

(62) Division of application No. 14/454,165, filed on Aug. 7, 2014, now Pat. No. 9,986,647.

(30) Foreign Application Priority Data

Aug. 16, 2013 (TW) .............................. 102129528 A
Jun. 3, 2014 (TW) .............................. 103119250 A (51) Int. Cl.
*H05K 3/30* (2006.01)

(52) U.S. Cl.
CPC ... *H05K 3/305* (2013.01); *H05K 2201/10977* (2013.01); *H05K 2203/0195* (2013.01); *Y02P 70/613* (2015.11); *Y10T 29/49146* (2015.01); *Y10T 29/49155* (2015.01); *Y10T 29/5193* (2015.01)

(58) Field of Classification Search
CPC .......... H05K 3/305; H05K 2203/0195; H05K 2201/10977; Y02P 70/613; Y10Y 29/49146

See application file for complete search history.

(56) References Cited

FOREIGN PATENT DOCUMENTS

| JP | 2001079483 A | * | 3/2001 |
| JP | 2002198383 A | * | 7/2002 |
| JP | 2010232671 A | * | 10/2010 |

* cited by examiner

*Primary Examiner* — Livius Radu Cazan
(74) *Attorney, Agent, or Firm* — WPAT, PC (57) ABSTRACT

This invention provides a method and apparatus for manufacturing electronic devices. The method includes: providing a substrate having a first surface; providing an electronic device having bumps; mounting the bumps to the first surface to form an integrated unit; applying a capillary underfill to multiple sides of the electronic device, enabling the underfill to creep along and fill the gap between the electronic device and the substrate; placing the integrated unit into a processing chamber; raising the temperature in the chamber to a first predetermined temperature; reducing the pressure in the chamber to a first predetermined pressure of a vacuum pressure, and maintaining the vacuum pressure for a predetermined time period; raising the pressure in the chamber to a second predetermined pressure higher than 1 atm, and maintaining the second predetermined pressure for a predetermined time period; and adjusting the temperature in the chamber to a second predetermined temperature.

6 Claims, 8 Drawing Sheets

Back pack space (109)

METHOD FOR MANUFACTURING ELECTRONIC DEVICES

I. CROSS REFERENCE TO RELATED APPLICATIONS

This application claims priority to U.S. patent application Ser. No. 14/454,165 filed on Aug. 7, 2014, which claims the benefit of foreign application from Taiwan Patent Application No. 102129528 filed on Aug. 16, 2013 and Taiwan Patent Application No. 103119250 filed on Jun. 3, 2014, the contents of which are hereby incorporated by reference in their entirety for all purposes.

II. BACKGROUND OF THE INVENTION

Technical Field

The present invention relates to a method and apparatus for manufacturing electronic devices.

Description of the Prior Art

In a conventional manufacturing process of electronic devices, a plurality of conductive bumps are typically used for attaching the electronic devices to a substrate, and a capillary underfill is applied to one or more sides of the electronic devices, enabling the underfill to creep along the gaps between the electronic devices and the substrate so as to fill these gaps. Typically, many small bubbles may exist in such underfill. Also, as shown in FIG. 3D, the underfill will creep along one or more sides of the electronic devices during the filling of the gaps. When a front edge of the underfill proceeds, an unfilled space may be formed at where the front edge meets another front edge due to various reasons, and this is referred to as "back pack phenomenon". Specifically, as the front edges of the underfill proceed from sides of the electronic devices toward the center thereof meet each other, the back pack phenomenon occurs, and bubbles are formed (i.e., back pack spaces). The bubbles formed from the back pack phenomenon and the small bubbles in the underfill will eventually become voids in the underfill. These voids may cause the reliability of the electronic devices to drop and problems of electrical failure. Furthermore, in the case that the pitch between the conductive bumps is less than 100 micrometers (µm) and/or the gaps between the electronic devices and the substrate are less than 50 micrometers (µm), a capillary underfill is typically applied to one single side of the electronic device in order to prevent the back pack phenomenon. However, due to such small pitch and gaps, applying the capillary underfill to one single side of the electronic device may cause a slow filling rate. This may result in difficulties in controlling the creeping speed of the front edge of the underfill as well as the back pack phenomenon. As a result, such process needs to be abandoned, and other processes and materials of higher cost are alternatively chosen to protect the conductive bumps, which is definitely a significant obstacle to the development of electronic device miniaturization.

Accordingly, there is a need for a method and apparatus for manufacturing electronic devices, in which a capillary underfill is applicable to the case that the pitch between conductive bumps are less than 100 micrometers and/or the gaps between the electronic devices and the substrate are less than 50 micrometers, so as to promote the miniaturization of electronic devices.

III. SUMMARY OF THE INVENTION

In order to solve the aforementioned problem, according to an aspect of at least one embodiment of the present invention, it is provided a method for manufacturing electronic devices, comprising: providing a substrate having a first surface; providing an electronic device having conductive bumps on at least one surface thereof; mounting the conductive bumps located on at least one surface of the electronic device to the first surface of the substrate so as to form an integrated unit, wherein a pitch between the conductive bumps is less than 100 micrometers (µm), a gap between the electronic device and the substrate is less than 50 micrometers (µm); applying an capillary underfill to multiple sides of the electronic device, so that the capillary underfill creeps along and fills the gap between the electronic device and the substrate, forming a protection for the conductive bumps; placing the integrated unit into a processing chamber; raising the temperature in the chamber to a first predetermined temperature; reducing the pressure in the chamber to a first predetermined pressure of vacuum pressure, and maintaining the vacuum pressure for a predetermined time period; raising the pressure in the chamber to a second predetermined pressure higher than 1 atm, and maintaining the second predetermined pressure for a predetermined time period; and adjusting the temperature in the chamber to a second predetermined temperature.

The first predetermined temperature and first predetermined pressure may be selected to reduce the volume of bubbles caused by back pack phenomenon resulting from the application of capillary underfill to multiple sides of the electronic device. Also, through gas dissolution and diffusion, the second predetermined temperature and second predetermined pressure may be configured to completely eliminate the bubbles with reduced volume from the gap between the electronic device and the substrate. The second predetermined temperature and second predetermined pressure may be modified in terms of parameters or sequence based on process requirements, so that the bubbles created by the back pack phenomenon can be eliminated in descending order of size.

According to at least one embodiment of the present invention, the capillary underfill may be applied to the case where a pitch between the conductive bumps is less than 100 micrometers (µm) and/or a gap between the electronic device and the substrate is less than 50 micrometers (µm). Accordingly, the miniaturization of electronic devices can be effectively promoted.

Other aspects and advantages of the present invention will be more apparent from the following detailed description in conjunction with the accompanying drawings for illustrating the principles and examples of the present invention. In addition, in order not to unnecessarily obscure the present invention, well-known devices and principles will not be described in detail in this specification.

V. DETAILED DESCRIPTION OF THE PREFERRED EMBODIMENTS

Figure 1:
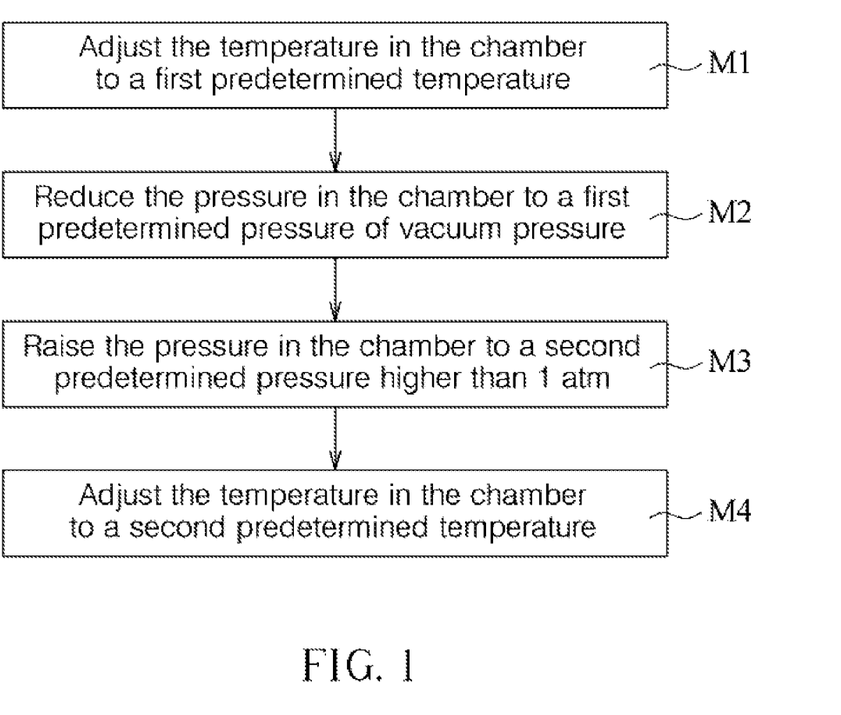
FIG. 1 is a flow chart showing a method for manufacturing electronic devices, according to an embodiment of the present invention.
Figure 2:
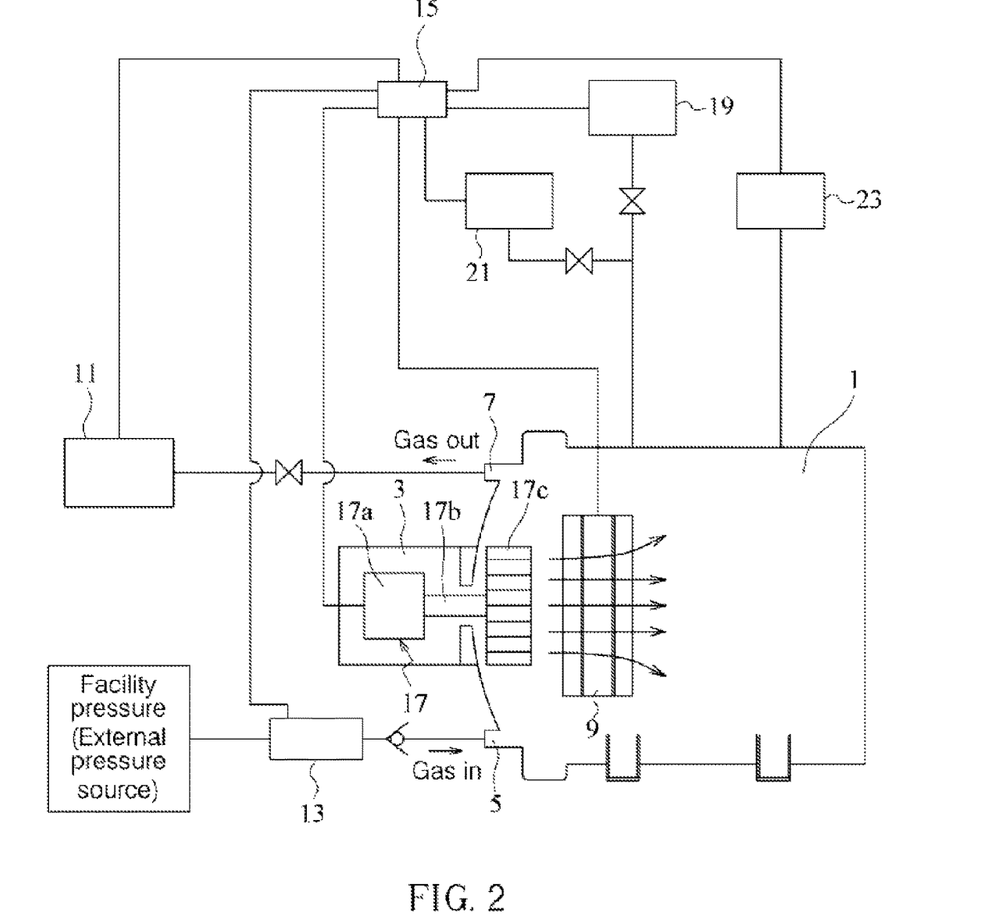
FIG. 2 is a schematic view showing an apparatus for manufacturing electronic devices, according to an embodiment of the present invention.
Figure 3A:
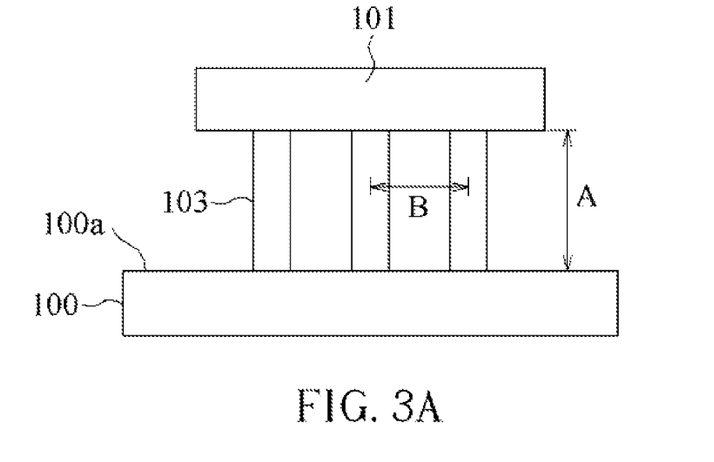
FIGS. 3A-3C is a schematic view showing a process of manufacturing electronic devices.
Figure 3B:
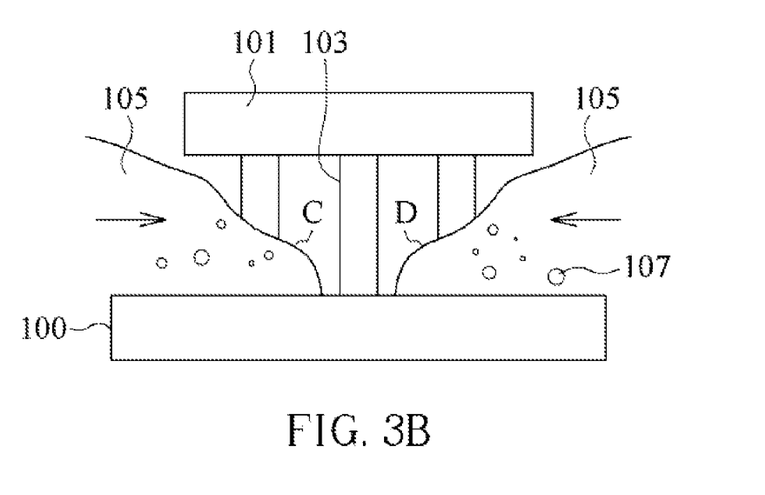
Figure 3C:
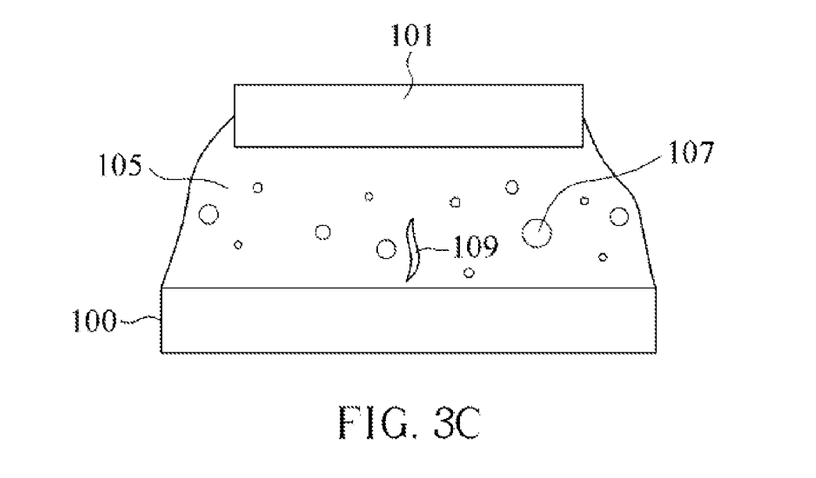
Figure 3D:
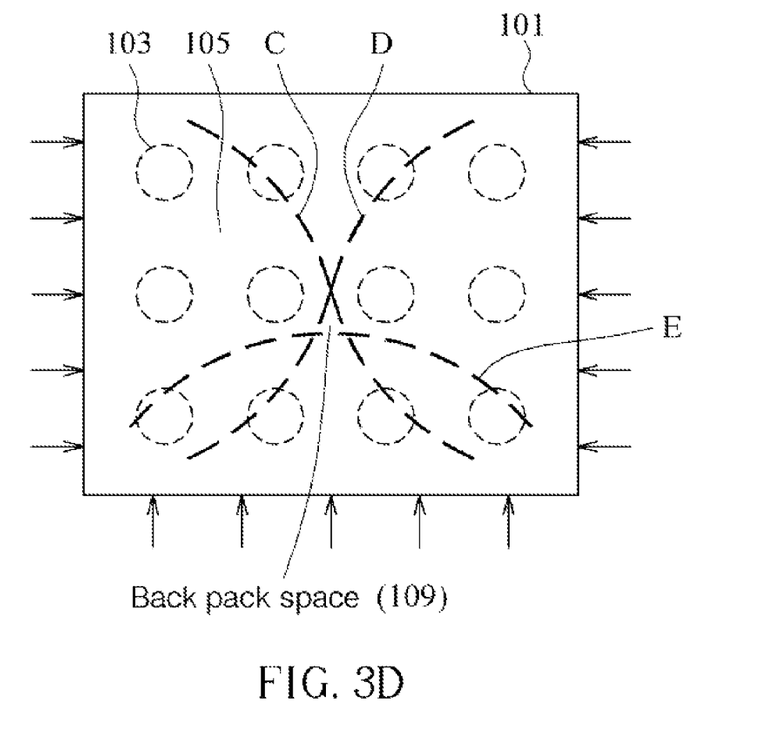
FIG. 3D is a schematic view showing back pack phenomenon which occurs when front edge of underfill meet each other in a three-side filling process.

According to an embodiment of the present invention, refer to FIGS. 3A-3C, a method for manufacturing electronic devices is provided, the method includes: providing a substrate 100 having a first surface 100a; providing an electronic device 101 having conductive bumps 103 on at least one surface thereof; attaching the conductive bumps 103 on at least one surface of the electronic device 101 to the first surface 100a of the substrate 100 so as to form an integrated unit, wherein a pitch B between the conductive bumps 103 is less than 100 micrometers (μm), and a gap A between the electronic device 101 and the substrate 100 is less than 50 micrometers (μm); applying an capillary underfill 105 to multiple sides of the electronic device 101, so that the underfill 105 will creep along and fill the gap A between the electronic device 101 and the substrate 100, the conductive bumps 103 will therefore be coated and isolated by the underfill 105, and a protection for the conductive bumps 103 can be formed. Next, the integrated unit is placed into a processing chamber 1 as shown in FIG. 2; the temperature in the chamber is adjusted to a first predetermined temperature for increasing the fluidity of the underfill 105; with reference to FIG. 1, M1, the pressure in the chamber is reduced to a first predetermined pressure of vacuum pressure, M2, and such vacuum pressure is maintained for a predetermined time period, in order to remove most of bubbles 107 and bubbles (back pack spaces) 109; the pressure in the chamber is then raised to a second predetermined pressure above 1 atm, M3, and the second predetermined pressure is maintained for a predetermined time period, M4; and the temperature in the chamber is adjusted to a second predetermined temperature, in order to remove the remaining bubbles 107 and bubbles (back pack spaces) 109. For example, in an embodiment of the present invention, the second predetermined pressure can be higher than 1 atm and lower than or equal to 20 atm, but is not limited thereto.

In one embodiment of the present invention, the pressure in the chamber may be reduced to the first predetermined pressure in a multi-stage manner. Alternatively, the pressure in the chamber may be reduced to the first predetermined pressure in a ramp-down manner.

In one embodiment of the present invention, the pressure in the chamber may be raised to the second predetermined pressure in a multi-stage manner. Alternatively, the pressure in the chamber may be raised to the second predetermined pressure in a ramp-up manner.

Figure 5:
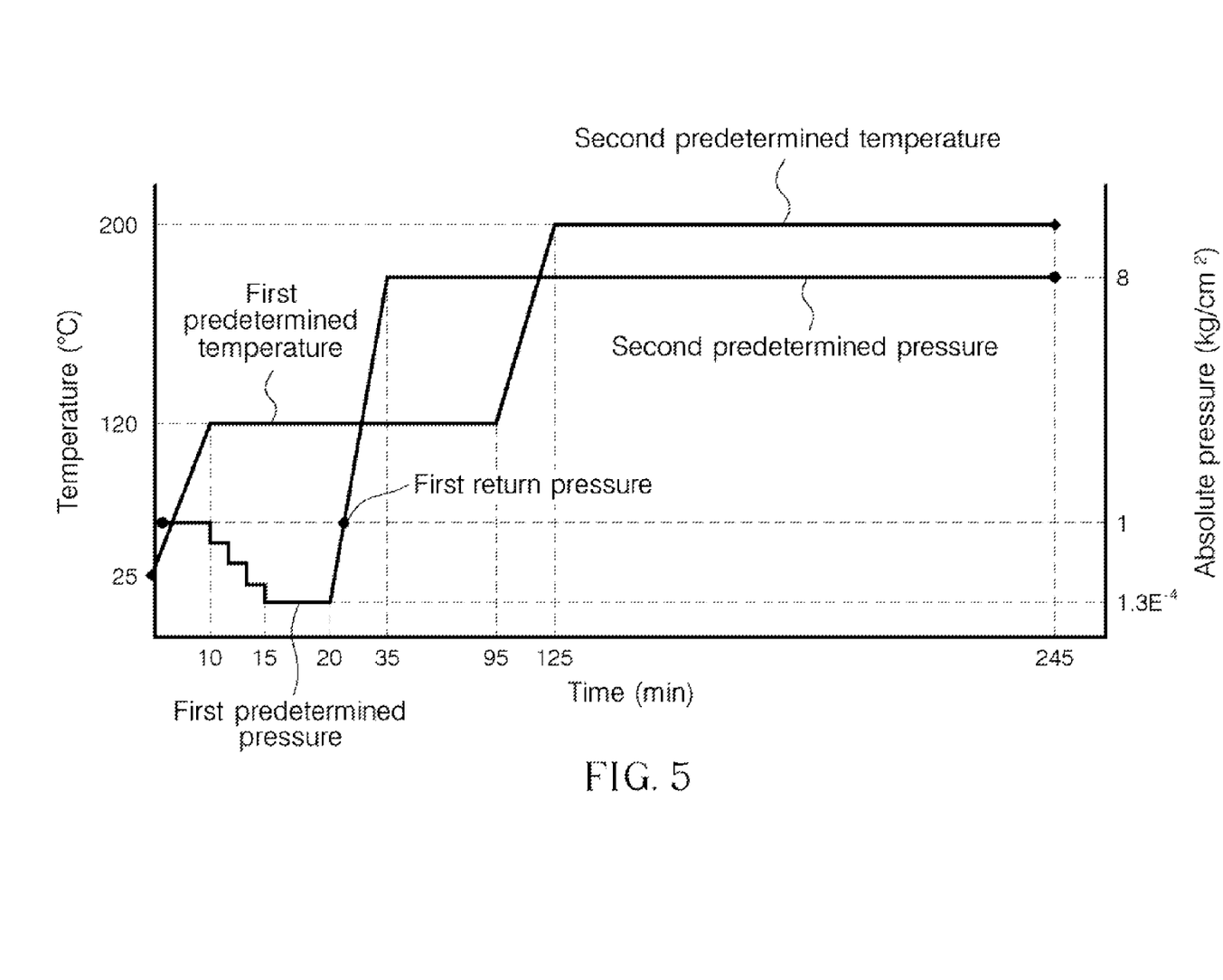
FIG. 5 is a graph showing the relationship among process temperature, process pressure and process time, according to an embodiment of the present invention.

FIG. 5 is a graph showing an example of the relationship among process temperature, process pressure and process time, according to an embodiment of the present invention. In FIG. 5, a multi-stage manner is employed for modulating the pressure and/or temperature within the chamber. It is to be understood that the process parameters in FIG. 5 are only shown as an example rather than limiting the present invention.

Figure 6:
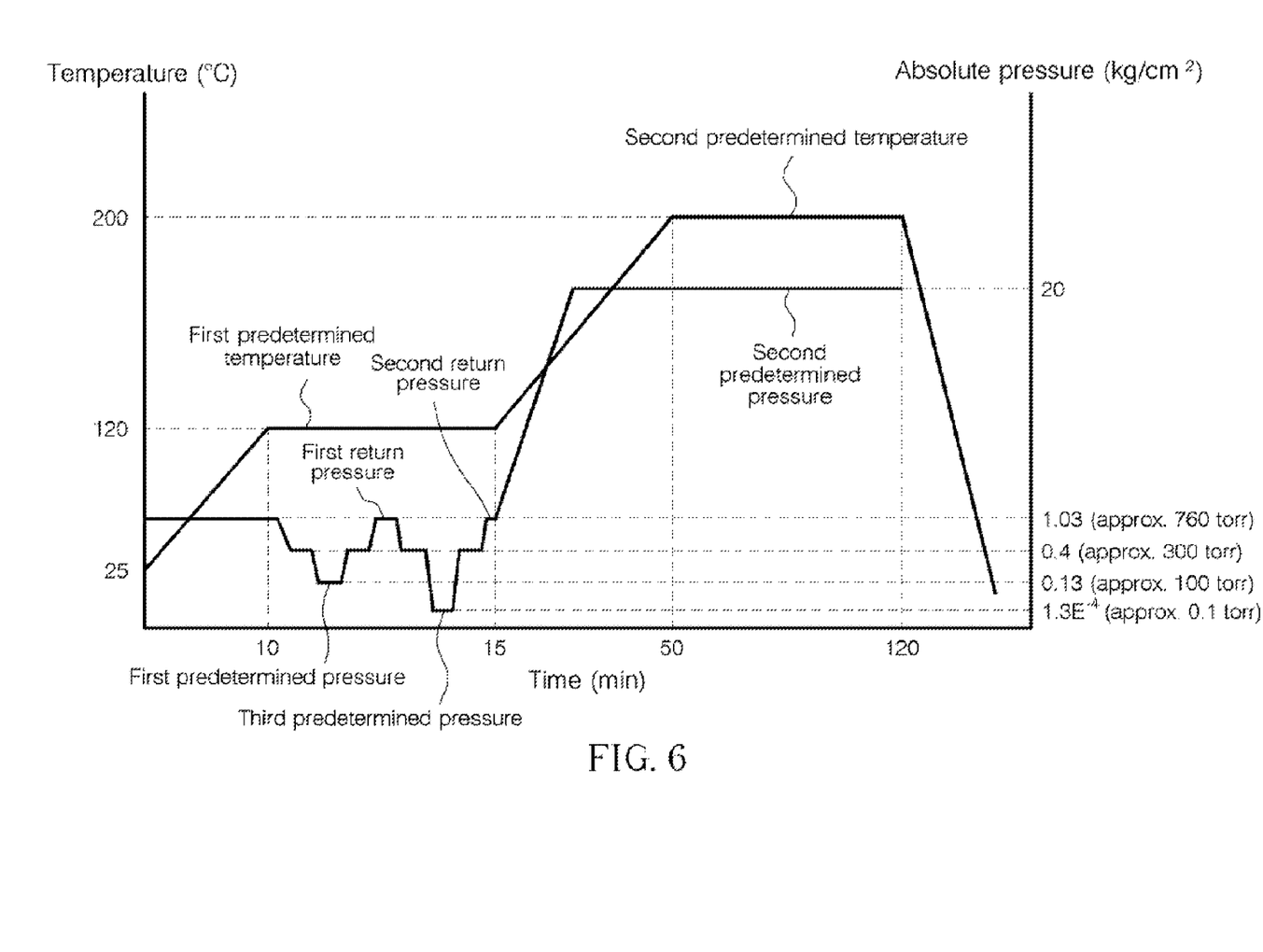
FIG. 6 is a graph showing the relationship among process temperature, process pressure and process time, according to another embodiment of the present invention.

FIG. 6 is a graph showing another example of the relationship among process temperature, process pressure and process time, according to another embodiment of the present invention. In FIG. 6, a multi-stage manner is employed for modulating the pressure and/or temperature within the chamber, wherein pressure return steps are further included. It is to be understood that the process parameters in FIG. 6 are only shown as an example rather than limiting the present invention.

In the embodiment shown in FIG. 6, a process for adjusting the pressure in the chamber may include steps of: (a) reducing the pressure in the chamber to the first predetermined pressure of vacuum pressure, and maintaining the first predetermined pressure for a predetermined time period (this step may be referred to as a "first pressure reducing" step); (b) raising the pressure in the chamber from the first predetermined pressure to a first return pressure (this step may be referred to as a "first pressure return" step), wherein the first return pressure ≤1 atm, or the first return pressure ≥1 atm; (c) reducing the pressure in the chamber to a third predetermined pressure of vacuum pressure, and maintaining the third predetermined pressure for a predetermined time period (this step may be referred to as a "second pressure reducing" step); and (d) raising the pressure in the chamber from the third predetermined pressure to a second return pressure (this step may be referred to as a "second pressure return" step), wherein the second return pressure ≤1 atm, or the second return pressure ≥1 atm. Based on process requirements, steps (a) to (b) may be carried out one or more times, and/or the steps (c) to (d) may be carried out one or more times. Next, the pressure in the chamber is raised to a second predetermined pressure higher than 1 atm, and the second predetermined pressure is maintained for a predetermined time period (this step may be referred to as a "pressurizing" step), wherein the second predetermined pressure is higher than the first return pressure and the second return pressure. The aforementioned steps (a) to (d) may be referred to as pre-pressure-adjustment steps, while the aforementioned "pressurizing" step may be referred to as a post-pressure-adjustment step. Other steps, may be inserted or overlapped between the pre-pressure-adjustment steps and the post-pressure-adjustment step, such as chamber temperature raising steps (e.g., steps for adjusting the temperature in the chamber to a first predetermined temperature or a second predetermined temperature).

In an embodiment of the present invention, the first predetermined pressure may be lower than, equal to, or higher than the third predetermined pressure; the first predetermined pressure is less than the first return pressure, the third predetermined pressure is less than the second return pressure; and the first return pressure may be lower than, equal to, or higher than the second return pressure.

In the embodiment shown in FIG. 6, the second return pressure may be maintained for a period of time after the pressure in the chamber has reached the second return pressure, and then the pressure in the chamber is raised to the second predetermined pressure. Alternatively, the pressure in the chamber may be raised to the second predetermined pressure right after it has reached the second return pressure.

For example, in an embodiment of the present invention, the first predetermined temperature may be between 30° C. and 150° C.; the second predetermined temperature may be between 100° C. and 300° C.; the first and third predetermined pressures may be between about $1.3 \times 10^{-4}$ kg/cm$^2$ and about 1.02 kg/cm$^2$ (about 0.1 torr-about 750 torr); the second predetermined pressure may be between about 1.3 kg/cm$^2$ and 20 kg/cm$^2$; the first and second return pressures may be between about $1.5 \times 10^{-4}$ kg/cm$^2$ and about 9.3 kg/cm$^2$ (about 0.11 torr-about $6.84 \times 10^3$ torr).

In an embodiment of the present invention, the step (a) may include: reducing the pressure in the chamber to the first predetermined pressure in a multi-stage manner. The step (c) may include: reducing the pressure in the chamber to the third predetermined pressure of vacuum pressure in a multi-stage manner. The step (b) may include: raising the pressure in the chamber from the first predetermined pressure to the first return pressure in a multi-stage manner. The step (d) may include: raising the pressure in the chamber from the third predetermined pressure to the second return pressure in a multi-stage manner. The aforementioned "pressurizing" step may include raising the pressure in the chamber to the second predetermined pressure in a multi-stage manner, or performing the pressure modulation in this step in a ramp-up manner. Of course, a ramp-up or ramp-down manner may also be employed in performing the pressure modulation in steps (a), (b), (c) and (d).

In addition, in the steps (a) and (c), when the pressure in the chamber is reduced in a multi-stage manner, solvents contained in the capillary underfill or other materials may be prevented from boiling due to vacuum, as well as material spattering and creeping issues caused by the boiling. Such boiling may cause creation of more bubbles. Therefore, the creation of pores may be further reduced by employing this multi-stage pressure reducing step (or "stepped" pressure reducing step).

Figure 7A:
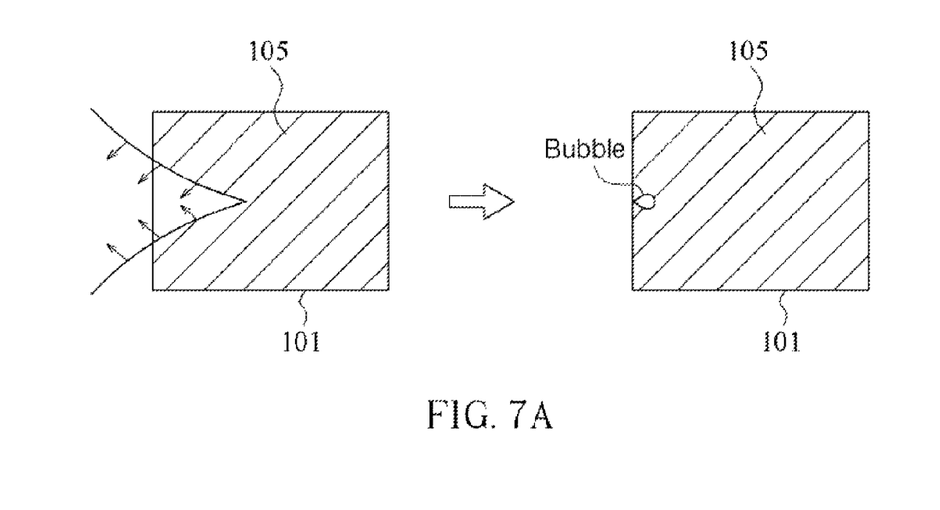
FIG. 7A is a schematic view showing a filling process employing a non-stage pressure return step (fast pressure return).
Figure 7B:
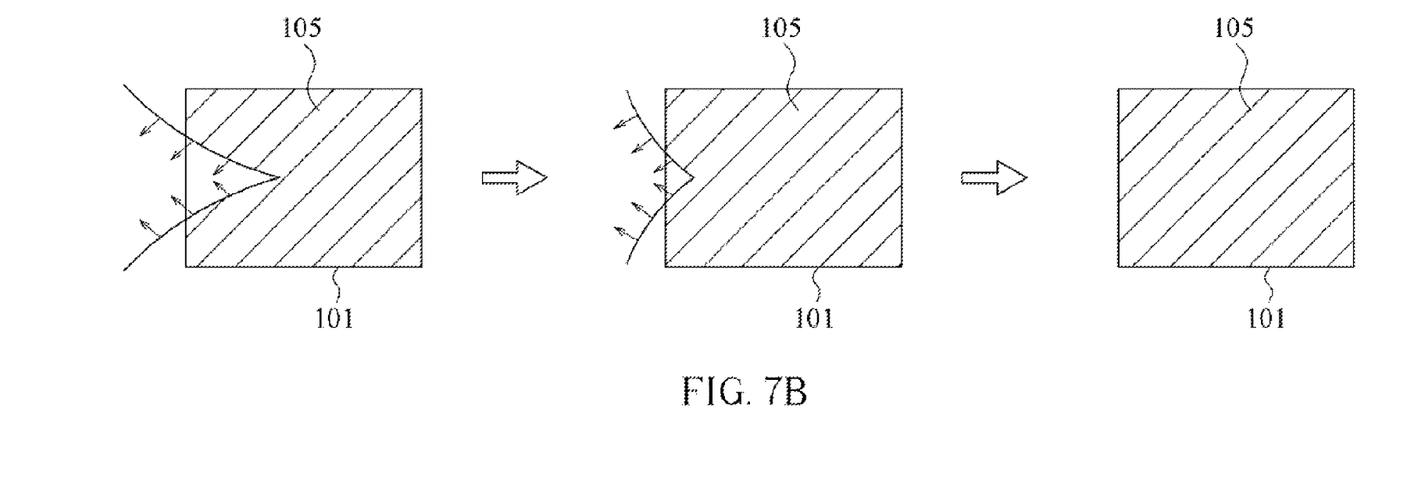
FIG. 7B is a schematic view showing a filling process employing a multi-stage pressure return step (slow pressure return) of the present invention.

Furthermore, the multi-stage pressure return steps may improve the defoamability of the capillary underfill (or capillary underfilling material) during the filling. For example, FIG. 7A is a schematic view showing a filling process employing a non-stage pressure return step (fast pressure return), and FIG. 7B is a schematic view showing a filling process employing a multi-stage pressure return step (slow pressure return) of the present invention. As shown in FIGS. 3B, 7A and 7B, since the flow velocity of the capillary underfill is slow, when filling with such capillary underfill, filling process employing a non-stage pressure return step (fast pressure return) (FIG. 7A) may cause the capillary underfill to have difficulty in smoothly squeezing out air between the substrate 100 and the electronic device 101, resulting in creation of bubbles. On the other hand, filling process employing a multi-stage pressure return step (slow pressure return) of the present invention (FIG. 7B) allows the capillary underfill to have sufficient time to squeeze out air between the substrate 100 and the electronic device 101 during the filling, the underfill can therefore fill up the spaces previously occupied by air, thereby reducing creation of bubbles.

Additionally, in the embodiment shown in FIG. 5, the step of raising the pressure in the chamber to the second predetermined pressure higher than 1 atm may include: raising the pressure in the chamber from the first predetermined pressure to the first return pressure, wherein the first return pressure ≤1 atm, or the first return pressure ≥1 atm; and raising the pressure in the chamber from the first return pressure to the second predetermined pressure. In other embodiments of the present invention, the pressure in the chamber may be raised from the first predetermined pressure to the first return pressure in a multi-stage manner, and/or raised from the first return pressure to the second predetermined pressure in a multi-stage manner.

In the embodiment shown in FIG. 5, the pressure in the chamber may be raised to the second predetermined pressure right after it has reached the first return pressure. Alternatively, the first return pressure may be maintained for a period of time after the pressure in the chamber has reached the first return pressure, and then the pressure in the chamber is raised to the second predetermined pressure.

In the embodiments of the present invention, the sequence for modulating the temperature and pressure in the chamber is not specifically limited. For example, in FIG. 5, for the modulation of the first predetermined temperature and the first predetermined pressure, the temperature in the chamber may be raised to the first predetermined temperature, followed by reducing the pressure in the chamber to the first predetermined pressure; or the pressure in the chamber may be reduced to the first predetermined pressure, followed by raising the temperature in the chamber to the first predetermined temperature; or the temperature in the chamber may be raised to the first predetermined temperature, with the pressure in the chamber being reduced to the first predetermined pressure in the meantime. Similarly, for the modulation of the second predetermined temperature and the second predetermined pressure, the pressure in the chamber may be raised from the first predetermined pressure to the second predetermined pressure, followed by adjusting the temperature in the chamber from the first predetermined temperature to the second predetermined temperature; or the temperature in the chamber may be adjusted from the first predetermined temperature to the second predetermined temperature, followed by raising the pressure in the chamber from the first predetermined pressure to the second predetermined pressure; or the pressure in the chamber may be raised from the first predetermined pressure to the second predetermined pressure, with the temperature in the chamber being adjusted from the first predetermined temperature to the second predetermined temperature. The process parameters may be modified depending on the types of the electronic device.

Moreover, although only "first predetermined temperature", "second predetermined temperature", "first predetermined pressure", "second predetermined pressure", and "third predetermined pressure" are described in this detailed description, when modulating the pressure and/or temperature within the chamber in the multi-stage or linear manner of the present invention, the temperature and pressure setting profiles may further include other temperature and pressure set points, such as other temperature set points, e.g., third, fourth and fifth predetermined temperatures, and/or other pressure set points, e.g., fourth, fifth and sixth predetermined pressures.

FIGS. 3A-3C is a schematic view showing a process of manufacturing electronic devices. As shown in FIGS. 3A-3C, in the process of manufacturing electronic devices, conductive bumps 103 located on at least one side of the electronic device 101 are mounted to the first surface 100a of the substrate 100 (FIG. 3A), the capillary underfill 105 is then applied to multiple sides of the electronic device 101 (FIG. 3B), enabling the underfill 105 to creep along and flow in the gap between the electronic device 101 and the substrate 100, thereby filling the gap, so a protection for the conductive bumps 103 can be formed (FIG. 3C). However, in the underfill 105, there often exist the small bubbles 107 as well as the bubbles (back pack spaces) 109 formed due to the back pack phenomenon as the front edges of the underfill meet each other. These bubbles 107 and bubbles (back pack spaces) 109 will become voids in the underfill, which may cause the reliability of the electronic devices to drop and problems of electrical failure. As shown in FIG. 3D, in the process that the underfill 105 fills up gap, the underfill 105 creeps along three sides of the electronic device 101, as three front edges C, D, E of the underfill proceed and meet each other, unfilled spaces (i.e. the bubbles (back pack spaces) 109 in FIG. 3C) may be formed. Further, in the case that the pitch between the conductive bumps 103 is less than 100 micrometers (μm) and/or the gap between the electronic device 101 and the substrate 100 is less than 50 micrometers (μm), the aforementioned capillary underfill is often unusable for protecting the conductive bumps 103 due to the void issue. This is apparently a serious obstacle to the development of electronic device miniaturization, since electronic device miniaturization is achieved through reducing the gap A and the pitch B. In view of this, the inventor has conceived at least one embodiment of the present invention.

Figure 4A:
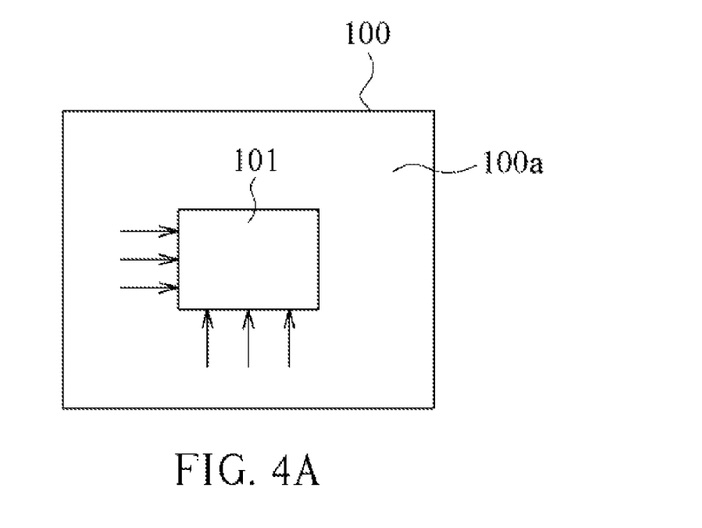
FIGS. 4A-4B are schematic views showing different ways of filling for the capillary underfill, respectively.
Figure 4B:
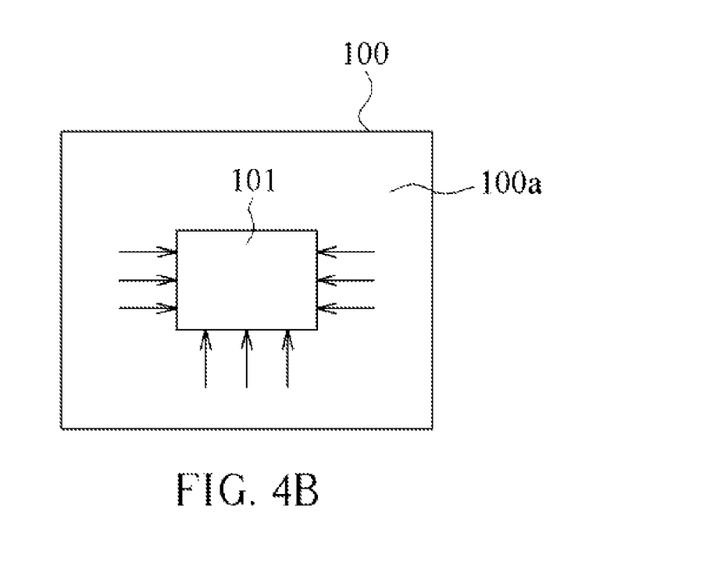

In an embodiment of the present invention, at least one method shown in FIGS. 4A-4B may be employed to apply the capillary underfill 105 to multiple sides of the electronic device 101, so that the underfill 105 will creep along and fill up the gap A between the electronic device 101 and the substrate 100. Although the substrate 100 and electronic device 100 in FIGS. 4A-4B are shown to be rectangular, the present invention may be applied to substrate and electronic devices of various shapes. In an embodiment of the present invention, the electronic device 101 may be a chip. In an embodiment of the present invention, the capillary underfill 105 may be a dielectric.

Regarding an apparatus for manufacturing electronic devices according to an embodiment of the present invention, as shown in FIG. 2, such apparatus may be connected to a facility pressure, that is, an external pressure source. The "facility pressure" is typically referred to a pressure provided by the factory staff. This apparatus may include: an extended space 3; a processing chamber 1 having one or more gas inlets 5, and one or more gas outlets 7, wherein the extended space 3 is in communication with the processing chamber 1, and the gas inlet 5 is connected the external pressure source; a temperature regulator 9 fitted in the processing chamber 1; a vacuum generator 11 fitted outside of the chamber and connected to the chamber 1 via the gas outlet 7; a controller 15; and a turbo fan 17 configured to generate a gas flow passing through the temperature regulator 9 and flowing toward the interior of the chamber 1. The temperature regulator 9, vacuum generator 11 and turbo fan 17 may be electrically connected to the controller 15 to allow signal transmission, thereby being controlled by the controller 15. The controller 15 may be configured to: raise the temperature in the chamber 1 to a first predetermined temperature with the temperature regulator 9; reduce the pressure in the chamber 1 to a first predetermined pressure of vacuum pressure and maintain this vacuum pressure for a predetermined time period, with the vacuum generator 11; raise the pressure in the chamber 1 to a second predetermined pressure higher than 1 atm and maintaining this second predetermined pressure for a predetermined time period, with the external pressure source; and adjust the temperature in the chamber 1 to a second predetermined temperature with the temperature regulator 9 and turbo fan 17. In an embodiment of the present invention, the controller may be further configured to: raise the pressure in the chamber 1 from the first predetermined pressure to a first return pressure, wherein the first return pressure ≤1 atm, or the first return pressure ≥1 atm; and raise the pressure in the chamber 1 from the first return pressure to the second predetermined pressure.

In another embodiment of the present invention, the controller 15 may be configured to: raise the temperature in the chamber 1 to a first predetermined temperature with the temperature regulator 9; pre-adjust the pressure in the chamber 1; raise the pressure in the chamber 1 to a second predetermined pressure higher than 1 atm and maintain this second predetermined pressure for a predetermined time period, with the external pressure source; and adjust the temperature in the chamber 1 to a second predetermined temperature with the temperature regulator 9 and turbo fan 17. The aforementioned step of pre-adjusting the pressure in the chamber 1 in at least one embodiment includes: (a1) reducing the pressure in the chamber 1 to a first predetermined pressure of vacuum pressure and maintaining the first predetermined pressure for a predetermined time period, with the vacuum generator 11; (b1) raising the pressure in the chamber from the first predetermined pressure to the first return pressure by, for example, turning off the vacuum generator 11 or making the chamber in communication with the atmosphere or the external pressure source, wherein the first return pressure ≤1 atm, or the first return pressure ≥1 atm; (c1) reducing the pressure in the chamber to a third predetermined pressure of vacuum pressure and maintaining the third predetermined pressure for a predetermined time period, with the vacuum generator 11; and (d1) raising the pressure in the chamber from the third predetermined pressure to the second return pressure by, for example, turning off the vacuum generator 11 or making the chamber in communication with the atmosphere or the external pressure source, wherein the second return pressure ≤1 atm, or the second return pressure ≥1 atm. Depending on process requirements, the steps (a1) to (b1) may be carried out one or more times, and/or the steps (c1) to (d1) may be carried out one or more times. In at least one embodiment, the second predetermined pressure is higher than the first return pressure and second return pressure.

In an embodiment of the present invention, the controller 15 may be a programmable logic controller (PLC).

In and embodiment of the present invention, the external pressure source (i.e., facility pressure) may be, for example, connected to a pressure regulating element 13. The pressure regulating element 13 may be electrically connected to the controller 15 to allow signal transmission, thereby being controlled by the controller 15 for completing the predetermined pressure setting in the chamber. When the external pressure source (facility pressure) is insufficient or unstable, the pressure within the chamber 1 may be enhanced or stabilized by the pressure regulating element 13, so as to enable the pressure in the chamber 1 to reach and stay at the second predetermined pressure higher than 1 atm. In an embodiment of the present invention, the pressure regulating element 13 may be a booster pump, a pressurizing cylinder, or the like.

Such apparatus may further include: a vacuum sensor 19 connected to the interior of the chamber 1 and configured to detect vacuum pressure in the chamber 1; a pressure sensor 21 connected to the interior of the chamber 1 and configured to detect the pressure in the chamber 1; and a temperature sensor 23 connected to the interior of the chamber 1 and configured to detect the temperature in the chamber 1. The vacuum sensor 19, pressure sensor 21 and temperature sensor 23 may be electrically connected to the controller 15 and transmit signals, thereby being controlled by the controller 15.

In an embodiment of the present invention, for example, the vacuum sensor 19 may be a vacuum gauge, and the pressure sensor 21 may be a pressure gauge. In an embodiment of the present invention, for example, the vacuum generator 11 may be a vacuum pump. In an embodiment of the present invention, for example, the temperature regulator 9 may be a heater, or a heater/cooler.

As described above, the turbo fan 17 may be configured to generate a gas flow passing through the temperature regulator 9 and flowing toward the interior of the chamber 1, thereby facilitating the temperature regulation in the chamber 1. For example, a convective heating effect may be achieved when the heating function of the temperature regulator 9 is turned on, while a convective cooling effect may be achieved when the cooling function of the temperature regulator 9 is turned on. The turbo fan 17 may include a driving motor 17a, a drive shaft 17b, and a turbine propeller 17c, wherein the driving motor 17a is provided in the extended space 3 in communication with the processing chamber 1, with the processing chamber 1 and extended space 3 having no shaft seals. In addition, the turbine propeller 17c is provided in the processing chamber 1, and the drive shaft 17b connects the driving motor 17a to the turbine propeller 17c.

In an embodiment of the present invention, multi-stage or linear pressure and/or temperature modulation may be accomplished via the controller 15. In a case that the pressure in the chamber is reduced to a predetermined vacuum pressure in a multi-stage manner, the controller 15 first activates a first stage vacuum setting and instructs the vacuum generator 11 to pump down the interior of the chamber. Next, as the controller 15 receives measurement signals from the vacuum sensor 19 and indicating that the pressure in the chamber has been reduced to the first stage vacuum setting, the controller 15 may further activate a second stage vacuum setting and instruct the vacuum generator 11 to pump down the interior of the chamber for reducing the pressure in the chamber to the second stage vacuum setting. Of course, as described above, such method may be employed to achieve multi-stage pressure raising operations in the chamber, or multi-stage heating/cooling operations in the chamber. Moreover, as described above, linear pressure and/or temperature modulation may be achieved via the control of the controller 15. For example, the controller 15 may be designed with functions of linearly increasing/decreasing profiles, so the pressure and/or temperature in the chamber may be modulated in a linear increasing/decreasing manner. Since the design of the controller is well-known to those skilled in the automatic control art, the design principles and methods thereof will not be described in detail.

Aspects of the present invention are described above with reference to a flowchart of a method, which may be embodied in computer program products according to embodiments of the invention. It will be understood that each block of the flowchart, and combinations of blocks in the flowchart, can be implemented by computer program instructions. These computer program instructions may be provided to a controller, a processor of a general purpose computer, special purpose computer, or other programmable data processing apparatus to produce a machine, such that the instructions, which execute with the processor of the computer or other programmable data processing apparatus, create means for implementing the functions/acts specified in the flowchart block or blocks.

These computer program instructions may also be stored in a computer readable storage medium that can direct a computer, other programmable data processing apparatus, or other devices to function in a particular manner, such that the instructions stored in the computer readable medium produce an article of manufacture including instructions which implement the function/act specified in the flowchart block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Each block in the flowchart may represent a module, segment, or portion of code, which includes one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart, and combinations of blocks in the block diagrams and/or flowchart, can be implemented by special purpose hardware-based systems that perform the specified functions or acts, or combinations of special purpose hardware and computer instructions.

While the present invention has been described in detail with reference to several preferred embodiments and the drawings, those skilled in the art would understand that a variety of alterations, modifications and equivalents are possible without departing from the true spirit and scope of the present invention. Nevertheless, it is intended that these alterations, modifications and equivalents fall into the scope of the appended claims of the present invention.

What is claimed is:

1. A method for manufacturing electronic devices, comprising:
    providing a substrate having a first surface;
    providing an electronic device having conductive bumps on at least one surface thereof;
    mounting the conductive bumps located on at least one surface of the electronic device to the first surface of the substrate so as to form an integrated unit, wherein a pitch between the conductive bumps is less than 100 micrometers, a gap between the electronic device and the substrate is less than 50 micrometers;
    applying an capillary underfill to multiple sides of the electronic device, so that the capillary underfill creeps along and fills the gap between the electronic device and the substrate, forming a protection for the conductive bumps;
    placing the integrated unit into a processing chamber;
    raising the temperature in the processing chamber to a first predetermined temperature;
    pre-adjusting the pressure in the processing chamber;
    raising the pressure in the processing chamber to a second predetermined pressure higher than 1 atm, and maintaining the second predetermined pressure for a predetermined time period, wherein the second predetermined pressure is between about 1.3 kg/cm$^2$ and 20 kg/cm$^2$; and
    adjusting the temperature in the processing chamber to a second predetermined temperature, wherein the pre-adjusting the pressure in the processing chamber comprises steps of:
- (a) reducing the pressure in the processing chamber to a first predetermined pressure of vacuum pressure, and maintaining the first predetermined pressure for a predetermined time period, wherein the first predetermined pressure is between $1.3 \times 10^{-4}$ kg/cm$^2$ and about 1.02 kg/cm$^2$; and
- (b) raising the pressure in the processing chamber from the first predetermined pressure to a first return pressure, wherein the first return pressure is between $1.5 \times 10^{-4}$ kg/cm$^2$ and about 1.03 kg/cm$^2$;
- (c) reducing the pressure in the processing chamber to a third predetermined pressure of vacuum pressure, and maintaining the third predetermined pressure for a predetermined time period, wherein the third predetermined pressure is between $1.3 \times 10^{-4}$ kg/cm$^2$ and 1.02 kg/cm$^2$; and
- (d) raising the pressure in the processing chamber from the third predetermined pressure to a second return pressure, wherein the second return pressure is between $1.5 \times 10^{-4}$ kg/cm$^2$ and about 9.3 kg/cm$^2$;

wherein the steps (a) to (d) are carried out one or more times, the second predetermined pressure is higher than the first return pressure, the second predetermined pressure is higher than the second return pressure, the first predetermined pressure is lower than, equal to or higher than the third predetermined pressure, and the first return pressure is lower than, equal to or higher than the second return pressure.

2. The method of claim 1, wherein in the step (a), the pressure in the processing chamber is reduced to the first predetermined pressure in a multi-stage manner.

3. The method of claim 1, wherein in the step (c), the pressure in the processing chamber is reduced to the third predetermined pressure of vacuum pressure in a multi-stage manner.

4. The method of claim 1, wherein in the step (b), the pressure in the processing chamber is raised from the first predetermined pressure to the first return pressure in a multi-stage manner.

5. The method of claim 1, wherein in the step (d), the pressure in the processing chamber is raised from the third predetermined pressure to the second return pressure in a multi-stage manner.

6. The method of claim 1, wherein the pressure in the processing chamber is raised to the second predetermined pressure in a multi-stage manner.

* * * * *